United States Patent [19]
Araki et al.

[11] Patent Number: 5,770,098
[45] Date of Patent: Jun. 23, 1998

[54] ETCHING PROCESS

[75] Inventors: Yoichi Araki, Yamanashi-Ken; Koichiro Inazawa, Tokyo-To; Sachiko Furuya, Tokyo-To; Masahiro Ogasawara, Tokyo-To; Chishio Koshimizu, Yamanashi-Ken; Tiejun Song, Kanagawa-Ken, all of Japan

[73] Assignee: Tokyo Electron Kabushiki Kaisha, Tokyo, Japan

[21] Appl. No.: 212,579

[22] Filed: Mar. 16, 1994

[30] Foreign Application Priority Data

| Mar. 19, 1993 | [JP] | Japan | 5-085494 |
| Mar. 31, 1993 | [JP] | Japan | 5-098553 |
| Apr. 28, 1993 | [JP] | Japan | 5-128495 |

[51] Int. Cl.$^6$ .................................................. H01L 21/02
[52] U.S. Cl. ...................... 216/67; 156/643.1; 156/646.1; 216/68; 216/79
[58] Field of Search .............................. 156/643.1, 646.1; 216/67.79, 68

[56] References Cited

U.S. PATENT DOCUMENTS

| 4,094,732 | 6/1978 | Reinberg | 156/646.1 |
| 4,176,004 | 11/1979 | Johnson et al. | 156/643.1 |
| 4,726,879 | 2/1988 | Bondur et al. | 156/643.1 |
| 5,108,542 | 4/1992 | Lin | 156/643.1 |
| 5,356,515 | 10/1994 | Tahara et al. | 156/643.1 |
| 5,368,684 | 11/1994 | Ishikawa et al. | 156/643.1 |
| 5,380,401 | 1/1995 | Jones et al. | 156/643.1 |
| 5,399,237 | 3/1995 | Keswick et al. | 216/68 |

FOREIGN PATENT DOCUMENTS

| 57-30292 | 6/1982 | Japan . |
| 61-142744 | 6/1986 | Japan . |
| 5-90217 | 4/1993 | Japan . |
| 5-94974 | 4/1993 | Japan . |

*Primary Examiner*—T. Tung
*Attorney, Agent, or Firm*—Beveridge, DeGrandi, Weilacher & Young, LLP

[57] ABSTRACT

In order to etch an object to be processed, such as a semiconductor wafer, the object to be processed is placed in a vacuum processing chamber, an etching gas is introduced into the vacuum processing chamber, and electrical power is applied to a pair of electrodes within the vacuum processing chamber by a high-frequency electrical power source. A mixed gas of carbon monoxide and a gas which does not contain hydrogen and which contains at least one element from the group IV elements and at least one element from group VII elements is used as the etching gas. A halogenated carbon gas, typically a fluorocarbon such as $C_4F_8$, is used as the gas containing elements from the group IV and group VII elements. The concentration of carbon monoxide in the etching gas could be 50% or more. At least approximately 86% of an inert gas, such as argon, xenon, krypton, or $N_2$ and $O_2$ could be added to the etching gas. Use of the above etching gas enables a high etching selectivity and prevents the formation of fences.

11 Claims, 14 Drawing Sheets

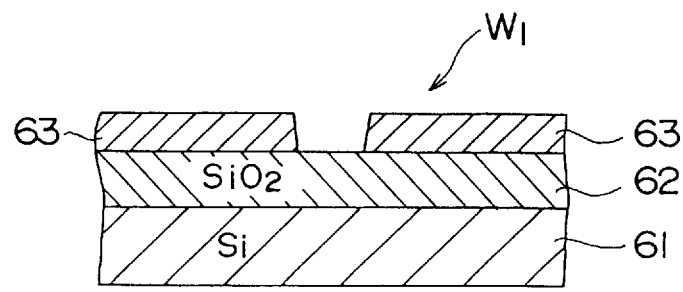
F I G. 2
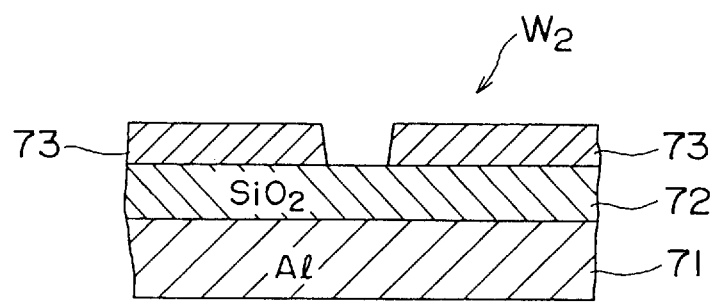
F I G. 3
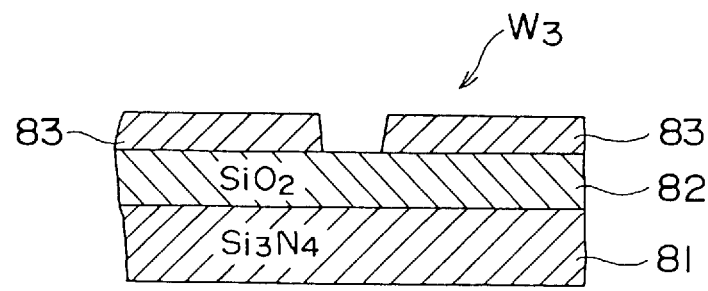
F I G. 4

T/W/B=60/60/20°C, He=20sccm, 10Torr, Chuck=2kV, Mag.=20rpm

| | | Th-SiO$_2$ E/R&Unif. | SiN E/R&Unif. | SiO$_2$/Si$_3$N$_4$ |
|---|---|---|---|---|
| CONVENTIONAL METHOD | CHF$_3$/CO | 40mT,650W,CHF3/CO=45/155 | 2830Å/M±3.6% | 2264Å/M±10.4% | 1.3 |
| | CF$_4$/H$_2$/O$_2$ | 40mT,650W,CF4/H2/O2=67/100/6 | 3309Å/M±7.1% | 4590Å/M±7.1% | 0.7 |
| PRESENT INVENTION | C$_2$F$_6$ | 30mT,650W,C2F6=10 | 5287Å/M±4.0% | 2283Å/M±8.1% | 2.3 |
| | | 30mT,650W,C2F6/CO=10/100 | 3085Å/M±3.6% | 794Å/M±3.1% | 4.8 |
| | C$_4$F$_8$ | 10mT,650W,C4F8=10 | 5124Å/M±6.9% | 1053Å/M±5.2% | 4.9 |
| | | 20mT,800W,C4F8/CO=10/200 | 3014Å/M±5.7% | 205Å/M±8.8% | 14.7 |

FIG. 6

ETCHING PROCESS

BACKGROUND OF THE INVENTION

The present invention relates to an etching process for performing etching on an object to be processed, such as a semiconductor wafer.

In prior art methods of dry-etching an object to be processed, such as a semiconductor wafer, when a contact hole is being etched in a plasma environment into a thin layer of $SiO_2$, which is a typical insulating material for a semiconductor element, the etching gas that is frequently used is a mixed gas to which $H_2$ is added, such as ($CF_4+H_2$), or a mixed gas of ($CH_2F_2+CO_2$) as disclosed in Japanese Patent Laid-Open No. 61-142744. Further examples of such etching gases include a mixed gas such as ($CHF_3+CO$), a mixed gas of $CO_2$ or carbon monoxide with a $CH_xF_y$ gas having hydrogen bonds, or a mixed gas containing $H_2$.

As a result, if, for example a mixed gas of $CHF_3$+ carbon monoxide is used, a high value of 50 can be obtained for the selectivity with respect to silicon (Si) (that is, the ratio of the etching rate of an $SiO_2$ layer formed on a silicon substrate, with respect to the etching rate of the silicon substrate). Even with a polycrystalline silicon layer, such as one of polysilicon, a high selectivity of 50 can be obtained.

Thus, during the etching of an oxide layer (typically $SiO_2$) in the prior art, etching is done with the addition of a suitable amount of $H_2$ or carbon monoxide in order to selectively etch the oxide layer rather than the substrate silicon or polycrystalline silicon, as described above.

However, if a mixed gas such as one with the addition of $H_2$ ($CF_4+H_2$) or one having hydrogen bonds ($CHF_3+CO$), is used as the above etching gas, the problem arises that a gas with such a high selectivity with respect to silicon or polysilicon has an extremely poor selectivity for other substrate materials, such as silicon nitride (SiN) or metals such as aluminum (Al). For example, if a mixed gas of $CHF_3$ and carbon monoxide is used, the selectivity with respect to SiN is no more than 1.0 and the selectivity with respect to aluminum is no more than about 4.0. If a conventionally used etching gas having hydrogen is used and etching is performed in an environment of a fluorine gas type of plasma with the substrate layer being SiN, the following reaction occurs:

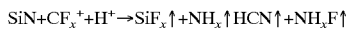

$$SiN+CF_x^++H^+ \rightarrow SiF_x\uparrow+NH_x\uparrow HCN\uparrow+NH_xF\uparrow$$

This promotes etching with respect to the substrate SiN, and, as a result, the selectivity with respect to SiN is lowered.

Concurrent with this, the spacing between adjacent gates (of polysilicon) has recently become even tighter as individual layers of the semiconductor element become thinner, which has increased demand for dimensional accuracy of the lithography used to form contact holes, but there is a limit to the dimensional accuracy of lithography. With the techniques of using prior art etching gases, it has become more likely that etching with strict selectivity between an oxide file ($SiO_2$) and a nitride layer ($Si_3N_4$) covering the polysilicon gates will be required during the formation by etching of self-aligning contact holes that will be used for gates of tighter spacing.

A further problem with prior art etching techniques is that reaction products, such as aluminum fluoride compounds (of the formula $AlF_x$) are often deposited on the side walls of the contact holes (generally called fences or crowns) after the etching, and thus a post-etching step, such as ashing or washing, is necessary to remove these products. However, removing these products is extremely difficult.

SUMMARY OF THE INVENTION

The present invention was devised in order to solve the above described problems and has as a first object the provision of an etching process that can provide extremely high selectivity, regardless of the type of substrate layer.

A second object of the present invention is to provide an etching process that can etch oxide and nitride layers with strict selectivity, even on an object to be processed that has extremely tight patterning.

A third object of the present invention is to provide an etching process that can prevent the formation of fences on the side walls of thus-formed contact holes.

An etching process in accordance with the present invention comprises the steps of: placing an object to be processed in a processing chamber, creating a vacuum within the processing chamber, introducing an etching gas into the processing chamber and subjecting the object to be processed to etching, wherein the etching gas is a mixture of carbon monoxide and a gas which does not include hydrogen but which contains at least one element from the group IV elements and at least one element from group VII elements.

The present invention further provides an etching process that comprises the steps of: placing an object to be processed in a processing chamber, creating a vacuum within the processing chamber, introducing a gas into the processing chamber and subjecting the object to be processed to etching, wherein the gas is a mixture of carbon monoxide and a gas which does not contain hydrogen but which contains at least one element from the group IV elements and at least one elements from group VII elements and the gas is used as an etching gas, and wherein a quantity of inert gas equal to or more than approximately 86% of the etching gas is used.

The present invention still further provides an etching process that comprises the steps of: placing an object to be processed in a processing chamber, creating a vacuum within the processing chamber, introducing a gas into the processing chamber and subjecting the object to be processed to etching, wherein the gas is a mixture of carbon monoxide and a gas which does not contain hydrogen but which contains at least one element from the group IV elements and at least one element from group VII elements and the gas is used as an etching gas, and wherein a gas mixed with a quantity of an inert gas equal to or more than approximately 86% of the etching gas and a gas containing oxygen is used.

In accordance with the present invention, since a mixed gas of carbon monoxide and an etching gas that does not include hydrogen is used, no reaction wherein $NH_x$ is generated occurs, even if the substrate layer is $Si_3N_4$. In other words, selectivity is greatly increased because there is no hydrogen to react with the nitrogen in the nitride layer. With the present invention, the addition of more carbon monoxide means that a carbon-rich atmosphere is obtained, so that the etching rate with respect to an oxide layer, such as an $SiO_2$ layer, is increased. In other words, if, for example, fluorine (F) is used as a group VII element is used, the presence of the carbon monoxide ensures that a carbon-rich deposited protective layer that does not normally react with the substrate layer is formed on the substrate layer. This protective layer prevents fluorine radicals from reaching the substrate layer, and thus the etching rate of the substrate layer is reduced by this blocking effect. This greatly increases the selectivity with respect to the substrate layer. The amount of carbon monoxide added is determined to be at least 50% but less than 100% of the entire etching gas; more preferably, at least 75% but less than 100%.

If at least 86% of an inert gas, such as argon or krypton, is added to the etching gas, the exclusion of the fluorine gas is more efficient. Taking $C_4F_8$ gas as an example, the addition of argon has the effect of increasing the amounts of $C_2F_2^+$ and $CF_2^+$ radicals which are the effective active species in etching, making it more difficult to promote the reactions of the $F^+$ radicals that tend to lower the selectivity, thus efficiently encouraging the etching.

The addition of very small amounts of oxygen or nitrogen to the etching gas can further encourage the etching by preventing the formation of carbon-based deposits and by forming the side walls of contacts holes perpendicular to the etching surface, to implement extremely fine etching with an aspect ratio of 6 or more.

BRIEF DESCRIPTION OF THE DRAWINGS

FIG. 2 is a partial cross-sectional view of a semiconductor wafer having a substrate of silicon, as an object to be processed by the etching process of the present invention;

FIG. 3 is a partial cross-sectional view similar to FIG. 2, but of a semiconductor wafer having a substrate of aluminum;

FIG. 4 is a partial cross-sectional view similar to FIG. 2, but of a semiconductor wafer having a substrate of $Si_3N_4$;

FIG. 6 is a table comparing selectivities obtained by prior art etching gases with selectivities obtained when etching gases of the present invention are used;

DESCRIPTION OF THE PREFERRED EMBODIMENTS

Figure 1:
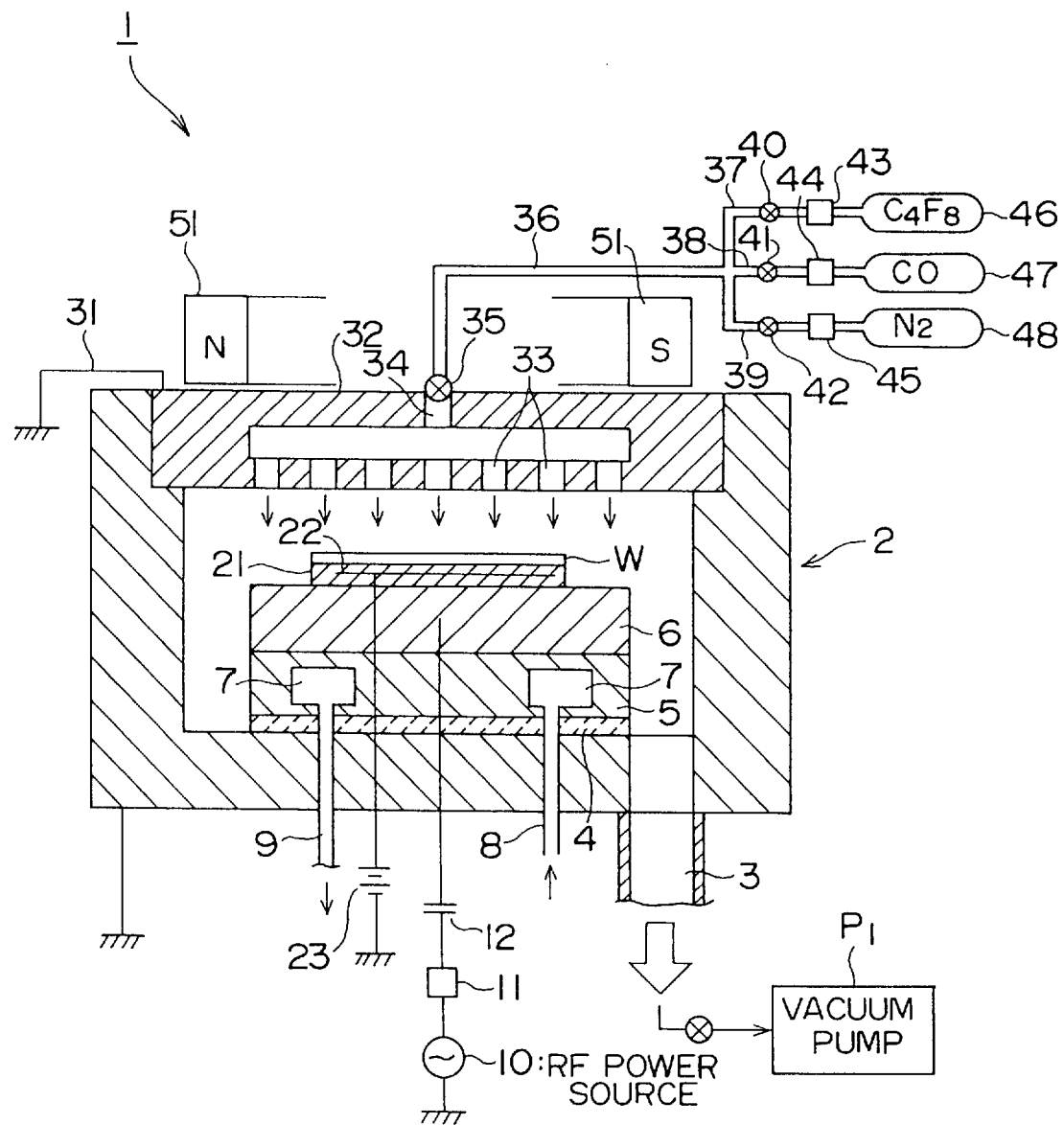
FIG. 1 is a vertical cross-sectional view of a magnetron RIE apparatus which is one example of a device for implementing the etching process of the present invention.

Embodiments of the present invention will now be described with reference to the accompanying diagrams, wherein FIG. 1 is a schematic view of the configuration of an etching apparatus for implementing an etching process of the present invention. This embodiment uses a magnetron reactive ion etching (RIE) apparatus 1.

This magnetron RIE apparatus 1 comprises therein a processing chamber 2 that is a sealed, electrically grounded vessel made of a material such as aluminum. The configuration is such that an exhaust pipe 3 leading to a vacuum pump P1 is connected to a base portion of the interior of the processing chamber 2, the interior of the processing chamber 2 can be evacuated uniformly from around the periphery of the base portion thereof, and thus the pressure within the processing chamber 2 can be set and maintained at any desired value, such as a few mTorr to a few hundred mTorr.

A susceptor support stand 5 is provided at the center of the base portion within the processing chamber 2 with an insulating plate 4 of ceramic or the like therebetween, and a susceptor 6 of a material such as aluminum that forms a lower electrode is provided on the upper surface of the susceptor support stand 5.

A cooling chamber 7 is formed in the interior of the susceptor support stand 5, and the configuration is such that a coolant medium (such as helium) introduced through a coolant introduction pipe 8 provided in the base portion of the processing chamber 2 and exhausted from a coolant exhaust pipe 9 is circulated within the cooling chamber 7. Thus the susceptor 6 can be set and maintained at any desired temperature within the range of, for example, −200° C. to +200° C. by the adjustment of a suitable temperature control device (not shown in the figure).

The susceptor 6 is configured such that high-frequency electrical power, such as 100 to 2500 W at 13.56 MHz, 40.68 MHz, or 380 kHz, is supplied through a matching circuit 11 and a blocking capacitor 12 from a high-frequency power supply 10 provided outside the processing chamber 2.

An electrostatic chuck 21 is provided on the upper surface of the susceptor 6, on which a semiconductor wafer W that is the object to be processed can be directly mounted and attracted thereto. The electrostatic chuck 21 has a configuration such that a conductive layer 22 formed of electrostatic copper foil is sandwiched on both sides between insulated bodies of, for example, polyimide film attached thereto, and a DC current provided by a high-voltage DC power source 23 provided outside the processing chamber 2 is applied to the conductive layer 22. When this DC voltage is applied, the semiconductor wafer W is attracted by the resultant coulomb force and held by the electrostatic chuck 21.

An upper electrode 32 that is electrically grounded via a ground wire 31 is provided in an upper portion of the interior of the processing chamber 2. The configuration of the upper electrode 32 is such that it has a hollow shape formed of a material such as amorphous carbon or SiC, a large number of gas diffusion holes 33 are provided in the upper electrode 32 in the surface thereof facing the semiconductor wafer W in the vertical direction, and a processing gas such as an etching gas supplied from a gas introduction port 34 provided in an upper portion of the upper electrode 32 is blown out uniformly toward the semiconductor wafer W from the large number of gas diffusion holes 33.

The gas introduction port 34 is connected via a valve 35 to a gas supply pipe 36, the gas supply pipe 36 divides into branch pipes 37, 38, and 39, and these branch pipes 37, 38, and 39 are connected to gas cylinders filled with different processing gases, with corresponding valves 40, 41, and 42 and mass-flow controllers 43, 44, and 45 that adjust the flow of supplied gas therebetween.

In this embodiment, the branch pipe 37 is connected to a cylinder 46 filled with $C_4F_8$ gas, the branch pipe 38 is connected to a cylinder 47 filled with carbon monoxide, and the branch pipe 39 is connected to a cylinder 48 filled with $N_2$.

The configuration is such that the amounts of gases supplied, as well as their mixing ratios, are adjusted by a suitable control device (not shown in the figure) and the mass-flow controllers 43, 44, and 45.

A known type of permanent magnet 51 is arranged on the upper surface of the upper electrode 32, adjacent thereto. This permanent magnet 51 is configured such that it is rotated about a rotational axis of the gas introduction port 34 at a predetermined rotational speed by a drive mechanism such as a motor (not shown in the figure), so that a uniform magnetic field of any desired value within a range of, for example, 10 to 1000 Gauss can be formed with respect to the surface of the semiconductor wafer W placed on the electrostatic chuck 21.

Etching performed with respect to the semiconductor wafer W by the magnetron RIE apparatus 1 configured as described above will now be described. First the semiconductor wafer W that is the object of the etching is conveyed into the processing chamber 2 from a known type of loadlock chamber (not shown in the figure) that is provided through a known type of gate valve (also not shown in the figure), and is placed on the electrostatic chuck 21. The semiconductor wafer W is then attracted to the electrostatic chuck 21 by the application of power from the high-voltage DC power source 23, and is held thereon. Subsequently, the pressure in the processing chamber 2 is reduced by exhaust through the exhaust pipe 3, until a vacuum of, for example, 20 mTorr is achieved.

Next, an etching gas is introduced into the processing chamber 2 from the gas introduction port 34. The present invention uses, as an etching gas, a mixture of carbon monoxide (CO) and a gas that does not contain hydrogen (H) but includes at least one element from the group IV elements and at least one element from group VII elements. Carbon (C) and silicon (Si) are examples of the group IV elements, and fluorine (F) and chlorine (Cl) are examples of the group VII elements.

Typical examples of etching gases containing elements from the group IV and group VII elements are halogenated carbon gases, particularly fluorocarbon gases with the formula $C_x F_y$, where the relationship $(y \leq 2x+2)$ holds. Preferably, in this formula, the value of x is between 1 and 12, inclusive.

Fluorocarbon gases include saturated fluorocarbon gases and nonsaturated fluorocarbon gases, where saturated fluorocarbon gases are represented by the general equation of $C_xF_y$, where $y=2x+2$, and include $CF_4$, $C_3F_8$, $C_5F_{12}$, $C_7F_{16}$, $C_9F_{20}$, $C_2F_6$, $C_4F_{10}$, $C_6F_{14}$, $C_8F_{18}$, and $C_{10}F_{22}$. Nonsaturated fluorocarbon gases are represented by the general equation of $C_xF_y$, where $y<2x+2$, and include $C_2F_4$, $C_2F_2$, $C_3F_7$, $C_3F_4$, $C_4F_8$, $C_4F_6$, $C_4F_4$, $C_4F_2$, $C_5F_{10}$, $C_5F_8$, $C_5F_6$, $C_5F_4$, $C_6F_{12}$, $C_6F_{10}$, $C_6F_8$, and $C_6F_6$. A saturated hybrid halogenated carbon gas:

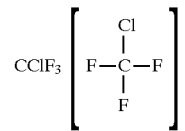

or a nonsaturated hybrid halogenated carbon gas:

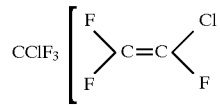

could also be used as the etching gas containing elements from the group IV and group VII elements.

Further, a gas such as $SiF_4$, $Si_2F_6$, $Si_3F_8$, or $SiCl_4$ could be used as the etching gas containing elements from the group IV and group VII elements.

An example wherein $C_4F_8$ is used as the etching gas will now be described in detail.

$C_4F_8$ gas flows into the processing chamber 2 from the gas introduction port 34 of the magnetron RIE apparatus 1 of FIG. 1 at a rate of 10 sccm, carbon monoxide flows at a rate of 200 sccm, but no $N_2$ is supplied by closing the valve 42. At the same time, 800-W power at 13.56 MHz is applied from the high-frequency power supply 10, and also a magnetic field is applied by creating a magnetic field of 120 Gauss in the vicinity of the center of the semiconductor wafer W by driving the permanent magnet 51 in rotation. The temperature of the semiconductor wafer W is then controlled to be between −50° C. and +20° C., and etching is performed with respect to the semiconductor wafer W.

The description now turns to the results obtained during etching in this manner in practice. The semiconductor wafers used as the test objects in these tests of actual etching were semiconductor wafers $W_1$ and $W_2$ shown in FIGS. 2 and 3, respectively. The semiconductor wafer $W_1$ shown in FIG. 2 is configured of a silicon substrate 61 with an $SiO_2$ layer 62 thereover as an oxide layer, and a suitable resist layer 63 is further formed over the $SiO_2$ layer 62. The semiconductor wafer $W_2$ shown in FIG. 3 is configured of an aluminum substrate 71 with an $SiO_2$ layer 72 thereover as an oxide layer, and a resist layer 73 is further formed over the $SiO_2$ layer 72.

The results of performing etching of the $SiO_2$ layer of these semiconductor wafers $W_1$ and $W_2$ under the previously described conditions proved that the selectivity (etching rate ratio) with respect to silicon in the semiconductor wafer $W_1$ was the same value of 50 as in the prior art, and also a high value of 50 can be obtained for the selectivity with respect to aluminum in the semiconductor wafer $W_2$.

In a semiconductor wafer $W_3$ shown in FIG. 4, a substrate 81 is of $Si_3N_4$, an $SiO_2$ layer 82 that is an oxide layer is formed thereover, and a resist layer 83 is formed over the $SiO_2$ layer 82. The results obtained by etching with respect to this semiconductor wafer $W_3$ are described below, with reference to the graph of FIG. 5.

Figure 5:
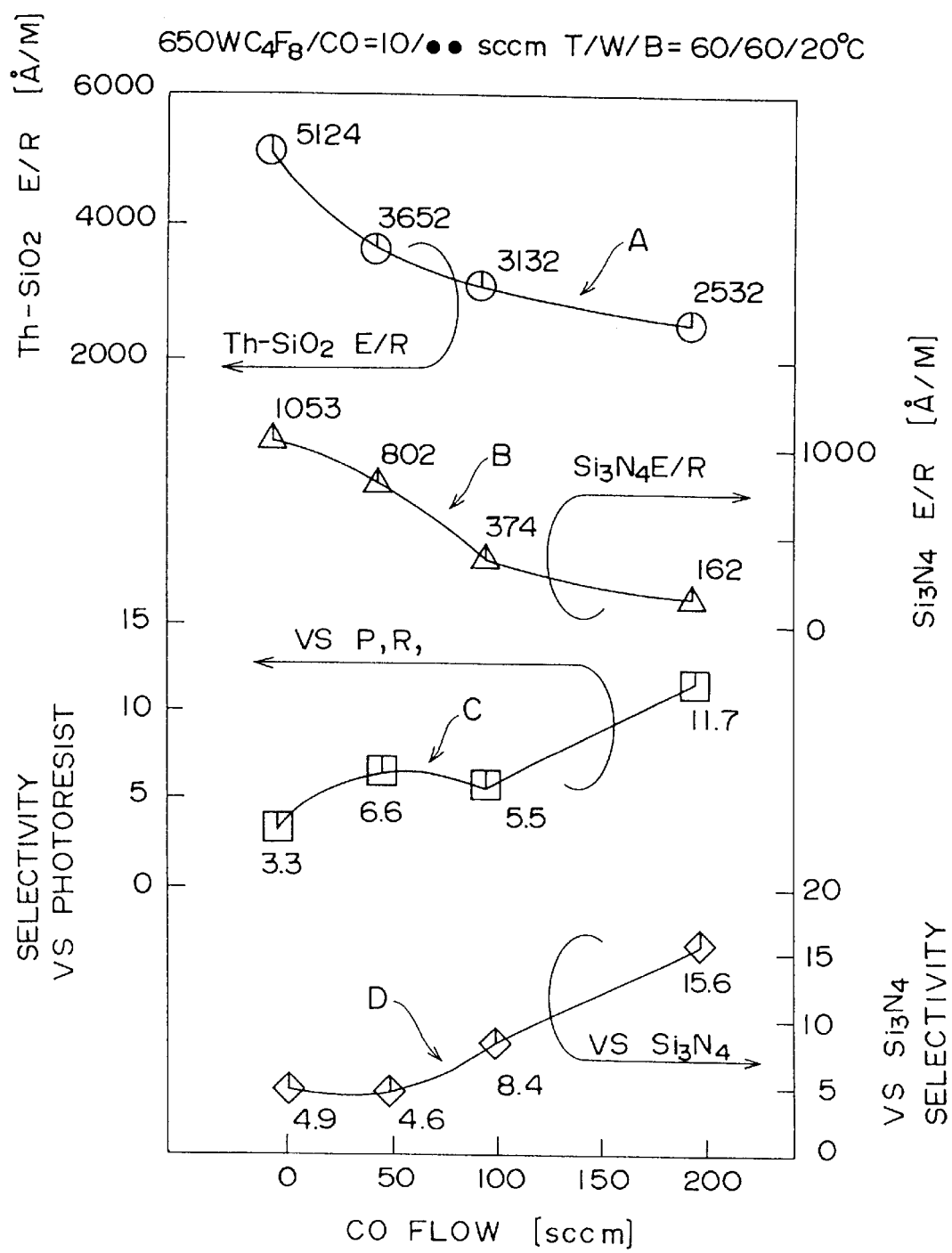
FIG. 5 is a graph of the results of etching the semiconductor wafer of FIG. 4.

In this case, the power was 650 W and, when the concentration of carbon monoxide in the mixed gas was changed by increasing the amount of carbon monoxide with respect to 10 sccm of $C_4F_8$ from 0 to 200 sccm, the etching rate (ER) of the thermal oxidation $SiO_2$ layer (Th—$SiO_2$) varied as shown by the characteristic curve A of FIG. 5, linking the measurement points indicated by hollow circles. The etching rate when the substrate was $Si_3N_4$ varied as shown by the characteristic curve B of FIG. 5, linking the measurement points indicated by hollow triangles. The selectivity with respect to the resist layer was as shown by the characteristic curve C of FIG. 5, linking the measurement points indicated by hollow squares. Finally, the selectivity with respect to $Si_3N_4$ was as shown by the characteristic curve D of FIG. 5, linking the measurement points indicated by hollow diamonds.

As can clearly be seen from this graph, the etching rates of $SiO_2$ and $Si_3N_4$ deteriorates gradually as the concentration of carbon monoxide in the gas increases. The selectivity with respect to the resist layer increases as the concentration of carbon monoxide in the gas is increased. The selectivity with respect to $Si_3N_4$ rises substantially linearly from a point at which the concentration of carbon monoxide is at least 50 sccm, and this selectivity rises as far as 15.6. It can thus be verified that, if the concentration of carbon monoxide in the mixture is high, a high selectivity is obtained accordingly.

Examining this still further, comparisons of selectivities obtained by using the prior art etching gases of $CHF_3$+CO and $CF_4$+$H_2$+$O_2$ and the $C_2F_6$ and $C_4F_8$ gases of the present invention to etch $Si_3N_4$ (an $SiO_2$ layer) are tabulated in FIG. 6. As can be seen from these tables, etching with the prior art etching gases containing hydrogen gave the extremely low selectivities of 1.3 for $CHF_3$+CO and 0.7 for $CF_4$+$H_2$+$O_2$. In contrast, selectivity rose dramatically to 4.8 when carbon monoxide was mixed with the $C_2F_6$ in accordance with the present invention and to 14.7 when carbon monoxide was mixed with $C_4F_8$. It can also be verified from experiments performed both with and without the mixing of carbon monoxide that, with both $C_2F_6$ and $C_4F_8$, the carbon-rich mixtures have improved selectivities. In other words, when no carbon monoxide is mixed with the gas, selectivities were 2.3 for $C_2F_6$ and 4.9 for $C_4F_8$; whereas, when carbon monoxide was mixed with the gas, the selectivities were 4.8 and 14.7, respectively.

In the example described with reference to FIG. 1, the proportion of carbon monoxide to etching gas (CO to $C_4F_8$) was 200 to 210 (approx. 95.2%), but it has been determined that selectivity rises if the concentration of carbon monoxide in the etching gas is at least 50% but less than 100%, and in particular there is a second change point at which the selectivity rises even further when the concentration of CO is at least 75% but less than 100%.

Figure 7:
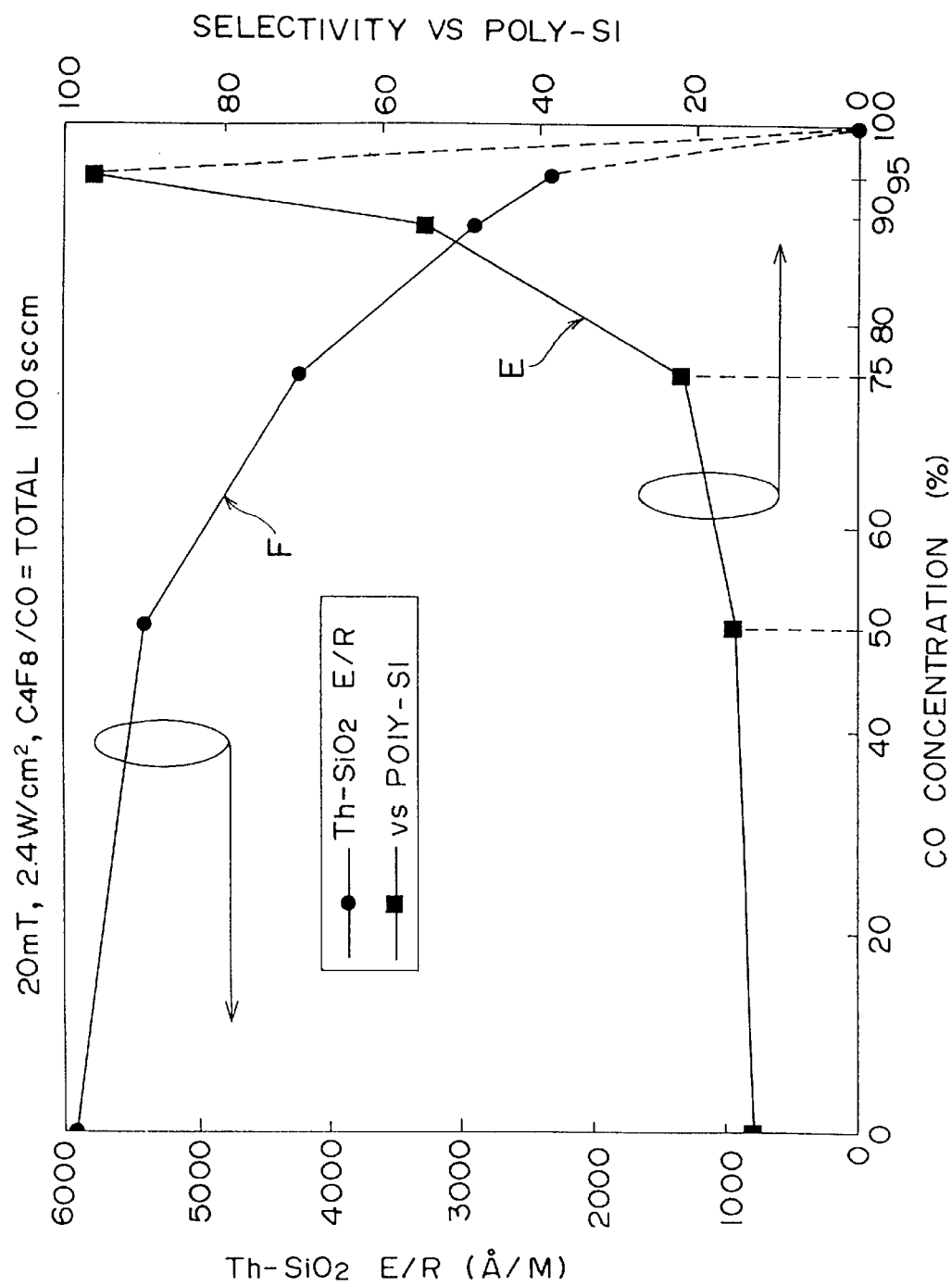
FIG. 7 is a graph of variations in etching rate and selectivity with the concentration of carbon monoxide in the etching gas.

This is illustrated in FIG. 7. In this graph, CO concentration (%) is plotted along the X-axis, etching rate (ER) is plotted along the Y-axis on the left side, and selectivity with respect to polysilicon is plotted along the Y-axis along the right side. As shown by the curve E in FIG. 7, the selectivity starts to increase from about 15 when the CO concentration passes 50%, and the selectively starts to rise dramatically when the CO concentration passes the vicinity of 75% until it is close to 100 in the vicinity of 95%. Note that this selectivity is considered to drop dramatically at concentrations of over 95%. The curve F shows the changes in etching rate for a thermal $SiO_2$ layer.

It should be noted that if a $C_x F_y$ gas is used as a component of the etching gas, it has been verified that selectivity increases even further with carbon-rich gases, that is, as the ratio of carbon to fluorine (C/F) in the gas increases, i.e., with $CF_4$, $C_2F_6$, $C_4F_8$, etc.

Figure 8:
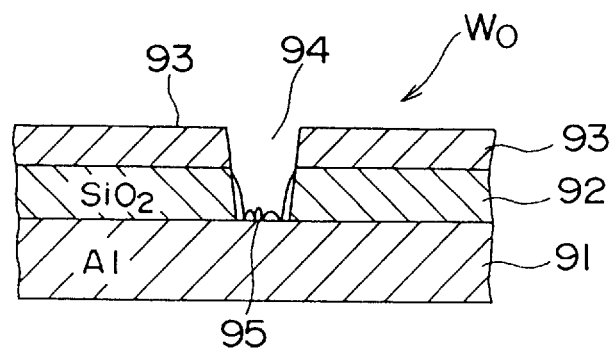
FIG. 8 is a partial cross-sectional view of the formation of a fence in a contact hole of a semiconductor wafer.

With a semiconductor wafer $W_0$ configured of a substrate 91 of aluminum, with an $SiO_2$ layer 92 formed thereon, and a resist layer 93 formed on the $SiO_2$ layer 92, as shown in FIG. 8, when a contact hole 94 is formed by etching with prior art etching techniques, a type of deposition called fences 95 is formed on the side walls of the contact hole 94 by these prior art techniques. These fences 95 are impurities containing aluminum or silicon, removing them is difficult, but not removing them causes faults such as contact defects when a conductive substance is poured into the contact hole 94 to form the wiring pattern, which leads to a deterioration in yield.

Figure 9:
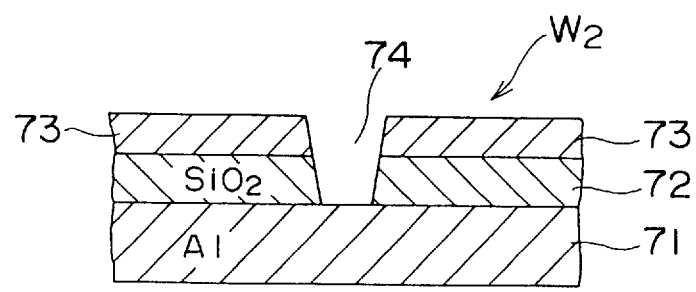
FIG. 9 is a partial cross-sectional view of a state in which no fence is formed in a contact hole of a semiconductor wafer.

However, it has been verified that in accordance with the above embodiment of the present invention, the effect of forming a contact hole by etching in the semiconductor wafer $W_2$ that has a substrate of aluminum, is a contact hole 74 in which virtually no fences are formed on the side wall, as shown in FIG. 9. This is considered to be due to the formation of a deposited protective layer of carbon on the surface of the aluminum substrate in the carbon-rich environment.

Thus it has been verified that the etching process in accordance with the present invention not only increases selectivity, it also has the advantage that fences are not formed.

Note that in the above described embodiment, the valve 42 (see FIG. 1) is closed and a mixture of $C_4F_8$ and carbon monoxide gases is used as the etching gas, but it has been verified that even better results can be obtained by opening the valve 42 to add $N_2$ to the etching gas. In such a case, the extra gas is not limited to $N_2$; similar results can be obtained by the addition of other inert gases such as argon (Ar).

Figure 10:
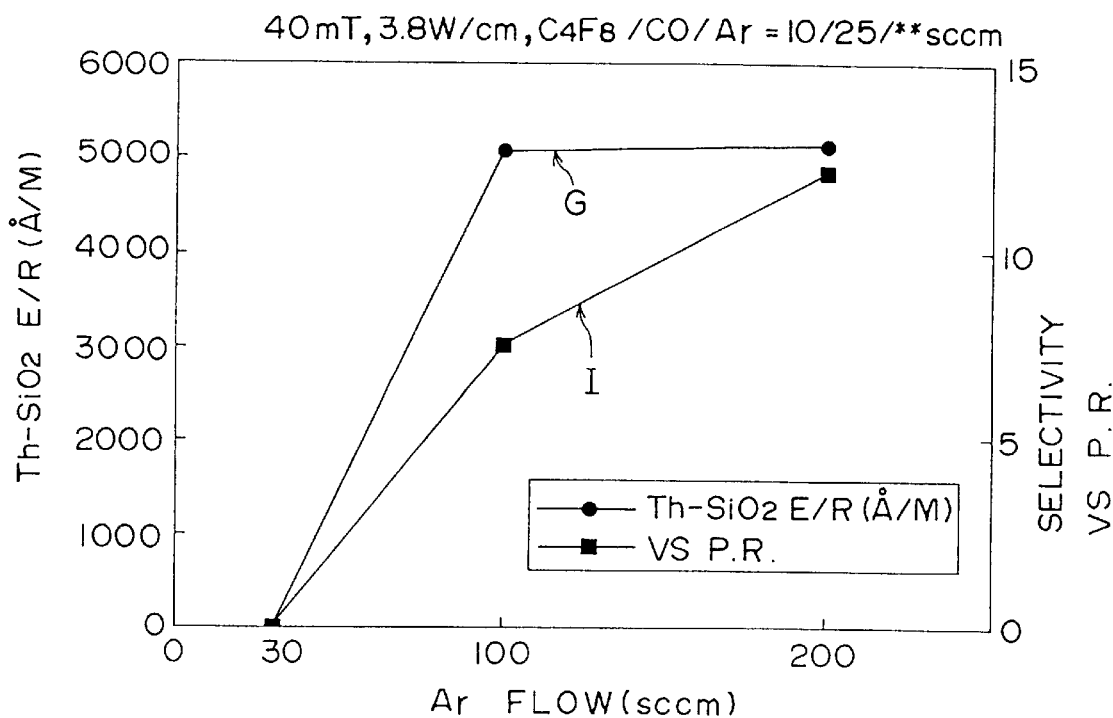
FIG. 10 is a graph illustrating the effect of the addition of an inert gas to the etching gas.

It has been determined that, if at least 30 sccm of an inert gas, such as a noble gas like argon, or $N_2$, is added to 35 sccm of the etching gas (a mixture of 10 sccm of $C_4F_8$ and 25 sccm of CO), the etching rate of a thermal $SiO_2$ layer is improved, as shown by the curve G in FIG. 10. The addition of 30 sccm of inert gas means that the inert gas is in the proportion of approximately 86% (30 sccm/35 sccm=86%) of the etching gas. The curve I in FIG. 10 shows changes in selectivity with respect to photoresist.

The reasons why the etching rate is increased are considered to be as described below. Substances such as chlorocarbons tend to deposit thickest in exposed portions where there is more of the $SiO_2$ oxide layer, and these portions are particularly difficult to etch. However, adding an inert gas such as argon to the etching gas obstructs these deposits by the sputtering effect, and diluting the active components with an inert gas reduces the amount of these deposits. Further, the fluorine gas is efficiently excluded so that, when a $C_4F_8$ type of gas is used, for example, the addition of argon has the effect of increasing the amounts of $C_2F_4^+$ and $CF_2^{30}$ radicals, which are the effective active species in the etching, but impeding the exclusion response of the $F^{30}$ radicals that tend to lower the selectivity, thus efficiently encouraging the etching. These two reasons ensure that etching is promoted easily.

Figure 11:
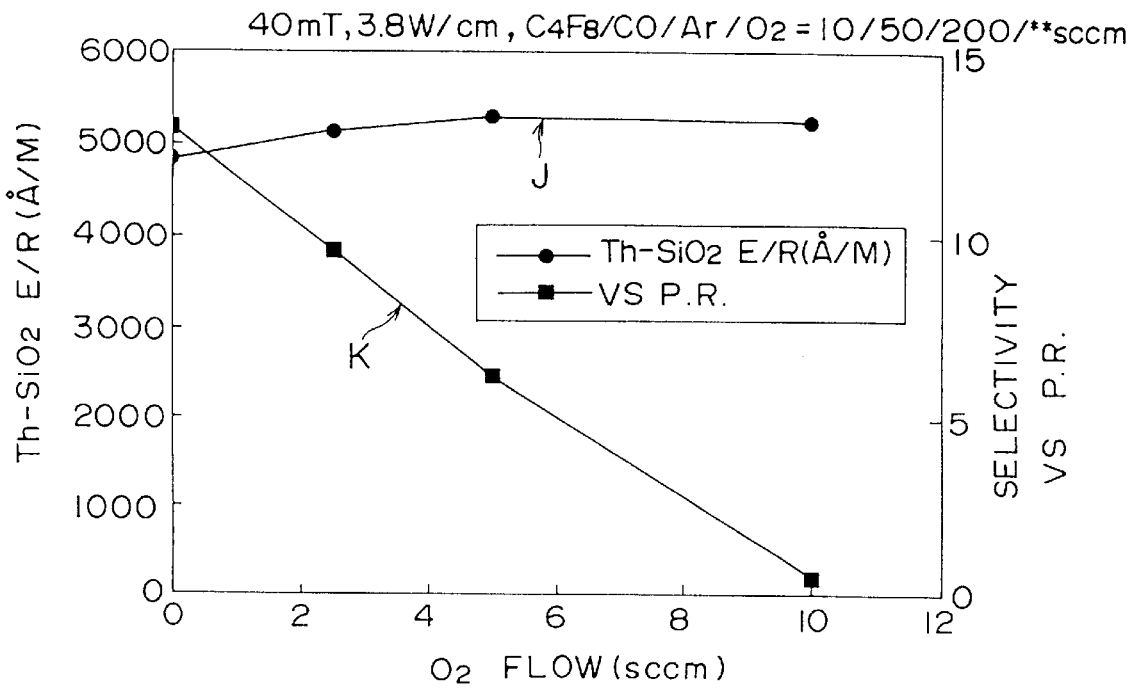
FIG. 11 is a graph illustrating the effect of the addition of oxygen to the etching gas.

It has been verified that a further increase in etching rate can be obtained by further adding a very small amount, no more than 10 sccm, of a gas containing oxygen atoms to an etching gas containing $C_4F_8$ and carbon monoxide and an inert gas such as argon, as shown in FIG. 11. Note that in FIG. 11, the curve J indicates the relationship between the etching rate of thermal $SiO_2$ and the amount of $O_2$ added, and the curve K indicates the change in selectivity with respect to photoresist corresponding to the amount of $O_2$ added. Note that, in FIG. 11, $O_2$ is merely taken as an example; other additives such as air or $N_2O$ could be considered.

The reason why the etching rate is increased is considered to be as described below. The addition of oxygen in a form such as $O_2$ is thought to obstruct carbon-based deposits and thus allow contact holes to be formed perpendicular to the etched surface, and also improve the etching rate of $SiO_2$. This very small addition of oxygen also has the effect of increasing the processing margin.

A magnetron RIE apparatus 1 was used in this embodiment of the etching method, but it should be clear to those skilled in the art that the present invention is not limited thereto; it can equally well be applied to any dry-etching apparatus which has a plasma in a reduced-pressure atmosphere within a processing chamber, such as a parallel flat-plate type of plasma apparatus, a parallel flat-plate type of RIE apparatus, or an ECR type of plasma apparatus.

Figure 12:
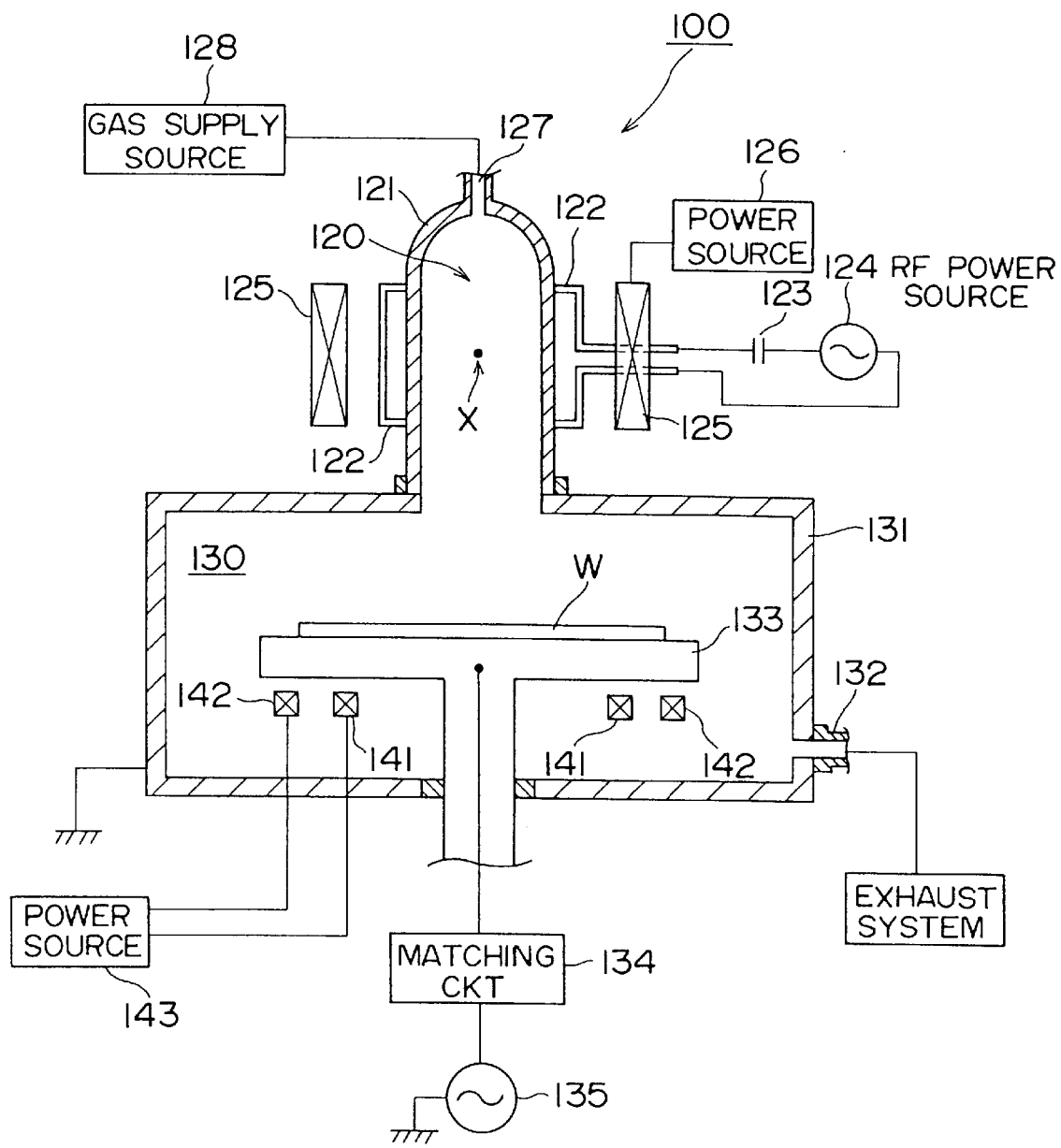
FIG. 12 is a schematic diagram of a plasma apparatus capable of being used for the implementation of the etching process of the present invention.

A schematic view of a plasma apparatus 100 that can be used to implement the process of the present invention is shown in FIG. 12. This plasma apparatus 100 has a plasma generation chamber 120 positioned in an upper part thereof, and a plasma processing chamber 130 which is positioned in a lower portion below the plasma generation chamber 120 and which is used for performing a process such as etching with respect to an object to be processed, such as a semiconductor wafer W, using a plasma generated within the plasma generation chamber 120.

The plasma generation chamber 120 has, for example, a substantially circular cylindrical shaped bell jar 121 having a dome shape in an upper part thereof, and an antenna 122 of a spiral form is arranged around the outer periphery of the bell jar 121 so as to surround it. The antenna 122 is configured in such a manner that high-frequency electrical power of, for example, 1 to 2000 W at a frequency of 13.56 MHz, is applied thereto from a high-frequency power source 124, via a blocking capacitor 123.

Around the outer periphery of the antenna 122 is arranged a main electromagnetic coil 125 for generating a magnetic field for plasma generation, of a configuration such that a static plasma excitation magnetic field of, for example, 1 to 600 Gauss, can be formed in the vertical direction within the plasma generation chamber 120 by the application of a DC current from a DC power source 126.

An etching gas introduction port 127 is provided in the uppermost portion of the bell jar 121, and the configuration is such that gases, such as the above described etching gas that does not contain hydrogen, as well as an inert gas such as argon, are introduced therethrough into the plasma generation chamber 120 from a gas source 128.

The plasma processing chamber 130 is formed within a grounded processing vessel 131 that is formed of a material such as aluminum, and it is configured such that the etching gas is introduced thereinto. An exhaust port 132 is provided in a lower part of a side wall thereof, and the interior of the plasma processing chamber 130 can be set to and maintained at a reduced-pressure atmosphere, such as $1.0 \times 10^{-3}$ to 1.0 Torr, by an exhaust means such as vacuum pump (not shown in the figure) through this exhaust port 132.

A susceptor 133 for mounting and holding a semiconductor wafer W is provided in the plasma processing chamber 130. This susceptor 133 is made of a material such as aluminum, it is connected to a high-frequency power source 135 via a matching circuit 134 outside the processing vessel 131, and is configured such that an RF bias is induced by the application of high-frequency electrical power at, for example, 13.56 MHz.

Annular auxiliary electromagnetic coils 141 and 142 of different diameters are arranged in sequence from the inside, below the susceptor 133 and concentric therewith. These auxiliary electromagnetic coils 141 and 142 are each excited independently by a power source 143 outside the processing vessel 131, and are configured such that predetermined magnetic fields are formed thereby in the vicinity of the semiconductor wafer W.

These auxiliary electromagnetic coils 141 and 142 enable the formation of a magnetic field of 5 to 20 Gauss over the semiconductor wafer W, divided into two concentric annular regions of different diameters.

The description now turns to etching in the plasma apparatus 100 and other components having the above described configuration. First the semiconductor wafer W that is the object to be etched is conveyed into the plasma processing chamber 130 from a loadlock chamber (not shown in the figure) provided via a gate valve (also not shown in the figure) in the plasma apparatus 100, it is mounted on the susceptor 133 and is held thereby. An electrostatic chuck or the like could be used as the holding means.

Subsequently, the previously described etching gas is introduced into the plasma generation chamber 120 from the etching gas introduction port 127 and, at the same time, the plasma generation chamber 120 and plasma processing chamber 130 are evacuated from the exhaust port 132 by the exhaust means and are held at a reduced-pressure atmosphere of, for example, 3 mTorr.

In this status, if high-frequency waves at 13.65 MHz are applied to the antenna by the high-frequency power source 124 so that an electrical field is induced in the plasma generation chamber 120, and, similarly, the main electromagnetic coil 125 is excited by the DC power source 126 to form a magnetic field of, for example, 650 Gauss within the plasma generation chamber 120, a plasma is generated in the plasma generation chamber 120 by helicon waves. This plasma moves in a spiral fashion so that the plasma is scattered as it is introduced into the plasma processing chamber 130 toward the semiconductor wafer W. This induces etching of the semiconductor wafer W.

The acceleration of the ions in the plasma can be controlled by applying an RF bias of, for example, 13.56 MHz to the susceptor 133 by the high-frequency power source 135, and by applying the RF bias as appropriate to suit the processing gas and the reduced-pressure atmosphere that is used, and thus suitable etching can be implemented with respect to the object to be processed.

If it is determined that, for example, the plasma density at the outermost peripheral portion of the semiconductor wafer W is less than that at the center thereof, the plasma density at the outermost peripheral portion could be increased. With this plasma apparatus 100, if the outer auxiliary electromagnetic coil 142 is excited and thus an electronic cyclotron resonance region is created in the outermost peripheral portion of the semiconductor wafer W, the plasma density at this outermost peripheral portion is increased and, as a result, the plasma density over the semiconductor wafer W can be made uniform. Note that electronic cyclotron resonance of about 10 to 15 Gauss can be induced by the plasma apparatus 100.

Figure 13:
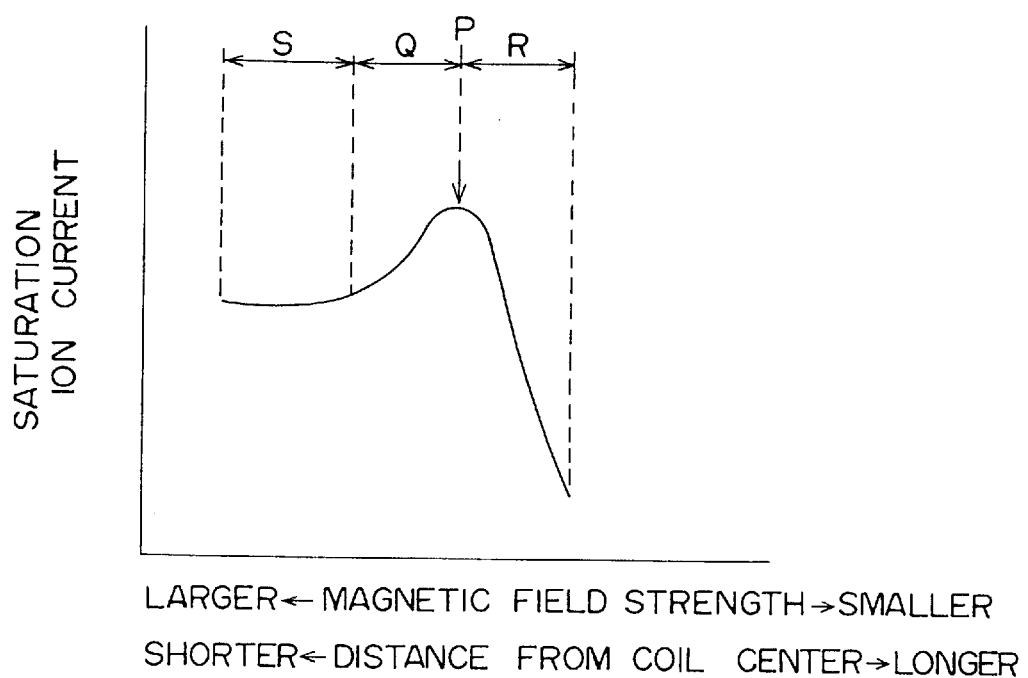
FIG. 13 is a graph illustrating the relationship between magnetic field and plasma density during the occurrence of cyclotron resonance.

The relationship between magnetic field and plasma density when electronic cyclotron resonance is induced is shown in FIG. 13. FIG. 13 shows an abbreviated characteristic obtained when magnetic field density is plotted along the X-axis and saturated ion current (which indicates plasma density) is plotted along the Y-axis, when 13.56 MHz is applied. A peak P of this characteristic is the point at which electronic cyclotron resonance occurs (which varies with the shape of the antenna, but is about 10 Gauss), and it is clear from this graph that plasma density drops steeply in a region R to the right of this peak P, but, conversely, tends to increase gradually in a region Q, while it is substantially flat in a region S where the magnetic field density is stronger than in the region Q. The characteristic shown in this graph is substantially the same as one obtained if, for example, the X-axis shows distance from the center of an electromagnetic coil in a magnetic field generation apparatus that forms a magnetic field for helicon-wave plasma generation. Therefore, a characteristic of this type can be used to correct for any variations in plasma density over the object to be processed.

When a helicon-wave plasma source as proposed in the prior art is used, since the plasma generation chamber is provided over the processing chamber that implements the processing of the object to be processed, and since the generated plasma is scattered as it is directed toward the object to be processed, the plasma density tends to become coarser toward the peripheral portion of the object to be processed. In such a case, if the plasma density could be increased at the peripheral portion of the object to be processed, the variations in the plasma density can be corrected for, and thus the plasma density can be made uniform over the object to be processed.

Figure 14:
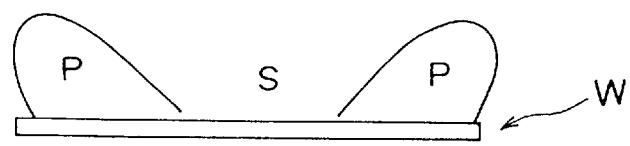
FIG. 14 is a diagram illustrative of an object to be processed when plasma density is controlled.

This will now be described in more detail. If a region of electronic cyclotron resonance is formed over the object to be processed by, for example, arranging that the portion P (electronic cyclotron resonance point) of the characteristic of FIG. 13 at the peripheral portion of the semiconductor wafer W and the portion S of the characteristic of FIG. 13 at the center portion of the object to be processed W, as shown in FIG. 14, the plasma density at the center portion of the object to be processed does not change but the density at the peripheral portion is increased, so that the plasma density over the entire object to be processed can be made uniform.

When the electronic cyclotron resonance region has been formed at the outermost peripheral portion of the wafer, as described above, the density gradient between the center portion and the outermost peripheral portion could be either steep or gentle, and thus, by making use of the P, R, and S portions of the graph of FIG. 13, the excitation level of the auxiliary electromagnetic coil 142 could be adjusted as appropriate to adjust the magnetic field strength in the vicinity of the semiconductor wafer W, and thus the position at which the electronic cyclotron resonance region is formed could be varied as appropriate. This operation makes it possible to adjust the plasma density locally to make it uniform despite the variations in the plasma density, in other words, the density gradient.

Since the plasma apparatus 100 is also provided with another independent auxiliary electromagnetic coil 141 within the auxiliary electromagnetic coil 142, if there should be any differences in the plasma density on the semiconductor wafer W caused by, for example, waves striking seen from the side surface, such density differences due to waves striking can be corrected by suitably operating the auxiliary electromagnetic coil 141 in correspondence thereto.

Such local adjustments ensure that the plasma density can be controlled when there are unwanted plasma density differences, so that, without using the auxiliary electromagnetic coils 141 and 142, adjustment could be by rotational movements of the arrangement position of the antenna 122 or by adjustment of the excitation level of the main electromagnetic coil 125 for plasma excitation that is provided outside the bell jar 121. Thus a cyclotron resonance region can be formed on the semiconductor wafer by making use of the P, R, and S portions of the graph of FIG. 13.

Figure 16:
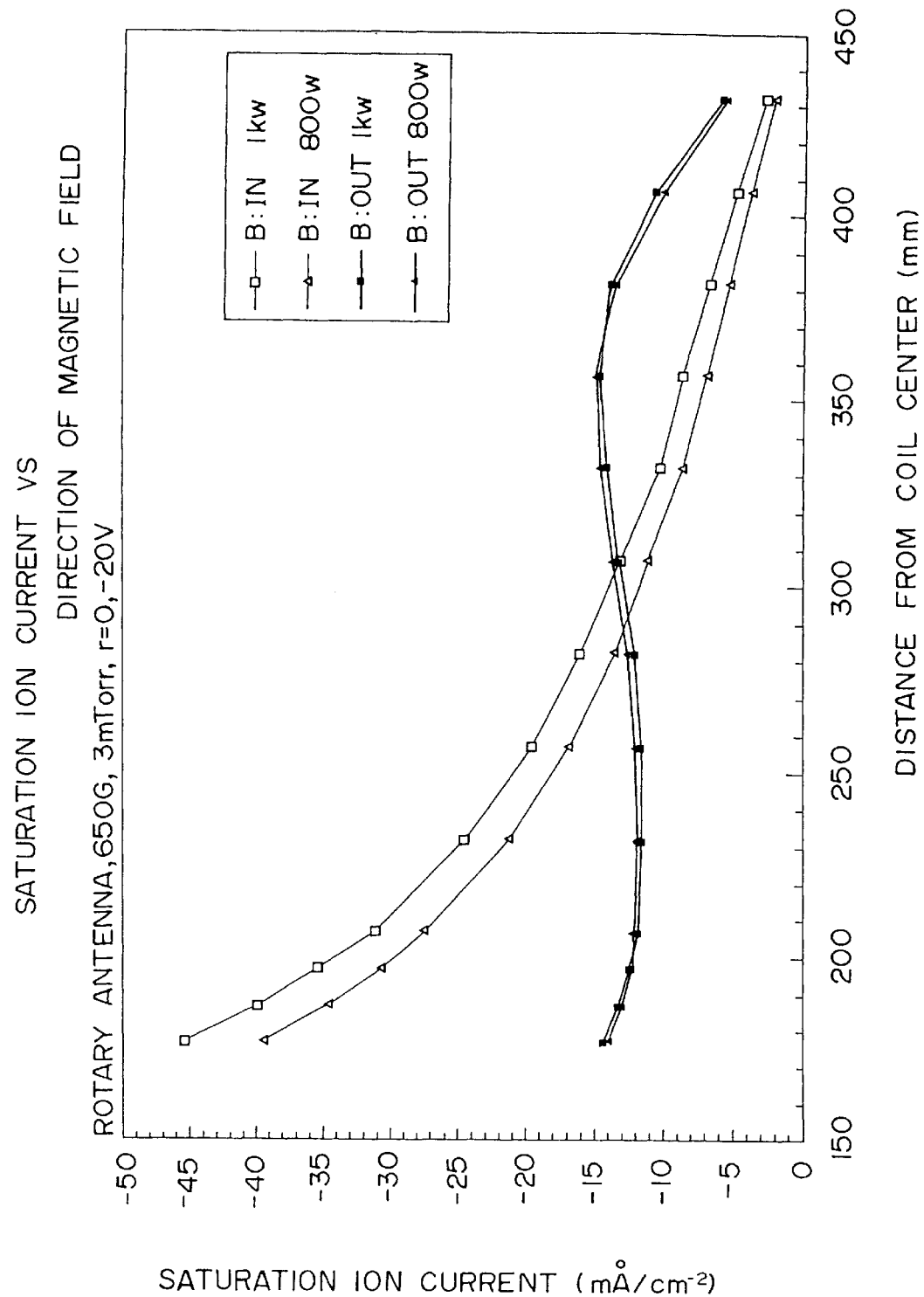
FIG. 16 is a graph illustrating the relationship between distance and plasma density, both when electronic cyclotron resonance is being generated and when it is not being generated.

Results obtained by forming an electronic cyclotron resonance region in the vicinity of the surface of the semiconductor wafer W when the plasma apparatus 100 is used in practice, by using only the main electromagnetic coil 125 for plasma excitation, not the auxiliary electromagnetic coils 141 and 142, are shown in FIG. 16.

In FIG. 16, distance from the center (the point X in FIG. 12) of the main electromagnetic coil 125, perpendicular to the direction toward the semiconductor wafer W, is plotted along the X-axis and saturated ion current (indicating the plasma density) is plotted along the Y-axis. The results when there is no electronic cyclotron resonance are plotted as fine lines; those when there is electronic cyclotron resonance are plotted as bold lines, with varying levels of power of the high-frequency power source 124 used as parameter.

It can be seen from this graph that plasma density deteriorates with distance from the center of the main electromagnetic coil 125 when there is no electronic cyclotron resonance, but the plasma density increases at the resonance point when there is electronic cyclotron resonance. In other words, the graph of FIG. 16 shows that there is a peak at approximately 350 mm from the center of the main electromagnetic coil 125, where the position of this peak is the electronic cyclotron resonance point. Note that the magnetic field strength at this point is 14 Gauss. It can be seen from this graph that there is virtually no change in this characteristic when the power of the high-frequency power source 124 is varied.

Further experiments have determined that a characteristic similar to that of the graph can be obtained even when the magnetic field strength generated by the main electromagnetic coil 125 within the plasma generation chamber 120 has dropped to 400 Gauss, and a peak can be seen at approximately 280 mm from the center of the main electromagnetic coil 125. The magnetic field strength at that peak is approximately 16 Gauss.

Therefore, it is possible to correct the plasma density by adjusting the magnetic field strength in the vicinity of the semiconductor wafer W by suitably manipulating the main electromagnetic coil 125, without using the auxiliary electromagnetic coils 141 and 142, so that electronic cyclotron resonance is induced on the semiconductor wafer W.

Note that, in this embodiment, both of the auxiliary electromagnetic coils 141 and 142 that form an auxiliary magnetic field generation device are positioned within the plasma processing chamber 130, but the present invention is not limited thereto; they can be positioned outside the plasma processing chamber 130, in other words, outside the processing vessel 131.

Further, the principles of the present invention can also be applied as appropriate to a prior art helicon wave plasma apparatus that uses a multi-pole magnetic field.

In such a case, when etching is performed on the object to be processed with a plasma using the energy of the helicon wave, small differences in the magnetic field strength can be used to control the plasma density on the object to be processed and thus make the plasma density uniform.

Since the electronic cyclotron resonance used during the above control of the plasma density can be implemented under a small magnetic field strength in the RF band, the magnetic field generation apparatus also can be made smaller than the type of apparatus also used the prior art electronic cyclotron resonance.

Figure 15:
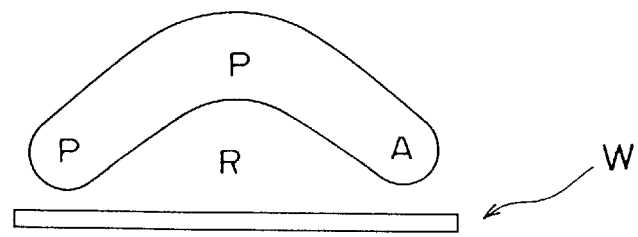
FIG. 15 is another diagram illustrative of an object to be processed when plasma density is controlled.

The electronic cyclotron resonance region has the property of making it difficult for electromagnetic waves to propagate. Therefore, if an electronic cyclotron resonance region is formed so as to cover the area above the semiconductor wafer W, as shown in FIG. 15, the helicon waves can be prevented from directly striking the object to be processed, and thus the object to be processed can be protected therefrom.

The etching method of the present invention can also be applied to the plasma apparatus shown in FIGS. 17–22. This plasma apparatus 200 is configured of a processing chamber 202 of a roughly circular cylindrical shape and made of, for example, aluminum with a plasma generation chamber 203 formed integrally as part of the processing chamber 202 at roughly the center of the side surface of the cylindrical processing chamber 202 and so as to surround it. An exhaust port 204 is provided at substantially the center of a top surface of the processing chamber 202, this exhaust port 204 communicates with an exhaust system 105 such as a vacuum pump so that the interior of the processing chamber 202 can be evacuated thereby. An etching gas introduction port 207 communicating with an etching gas source 206 is provided at a shoulder portion of the upper surface of the processing chamber 202, and the above described etching gas that does not contain hydrogen can be introduced into the processing chamber 202 through this etching gas introduction port 207.

A mounting stand 208 is provided within the processing chamber 202, and a semiconductor wafer W that has been conveyed into the processing chamber 202 from a loadlock chamber (not shown in the figure) through a gate valve (also not shown in the figure) can be placed and fixed onto an upper surface of the mounting stand 208 by a suitable fixing means such as an electrostatic chuck. A high-frequency power source 209 of, for example, 13.56 MHz is connected to the mounting stand 208 via a matching circuit that is not shown in the figure, and the configuration is such that an appropriate bias potential can be applied with respect to the semiconductor wafer W.

A pair of magnetic coils 210 and 211 are arranged outside the outer wall of the processing chamber 202 in such a manner as to sandwich the plasma generation chamber 203 from above and below. Since these coils are arranged so that matching poles are symmetrical on either side of the plasma generation chamber 203, a cusped magnetic field having a cusped magnetic field surface that cuts horizontally through the plasma processing space within the processing chamber 202 can be formed. The coils 210 and 211 are mounted movably in such a manner that the optimal cusped magnetic field formed thereby, and also the output magnetic force thereof can be adjusted by varying the applied current. This configuration ensures that the plasma flow supplied from the plasma generation chamber 203, in other words, the plasma density, can be adjusted optimally to suit the process. The strength of the output magnetic field can be set to be several hundred Gauss, for example, 400 Gauss, at an anode slit 231.

A cathode electrode 220 and an anode electrode 230 are arranged within the plasma generation chamber 203 in such a manner as to surround the plasma processing space within the processing chamber 202, in other words, in an annular form. A power source 240 is connected between these two electrodes 220 and 230, and the configuration is such that a charge is generated between the two electrodes 220 and 230. During this time, it is important that the arrangement and configuration is such that the cathode electrode 220 is arranged concentrically outside the anode electrode 230 so that when, as will be described below, a charge has been generated from the cathode electrode 220 with respect to the anode electrode 230, a flow of electrons caused by this charge is directed toward the center of the processing chamber 202.

A material with a high coefficient of electronic emission, such as lanthanum hexaboride, can be used as the material of the cathode electrode 220. A material that does not easily sputter at a high melting point, such as molybdenum, tungsten, or stainless steel, can be used as the material of the anode electrode 230.

Figure 18:
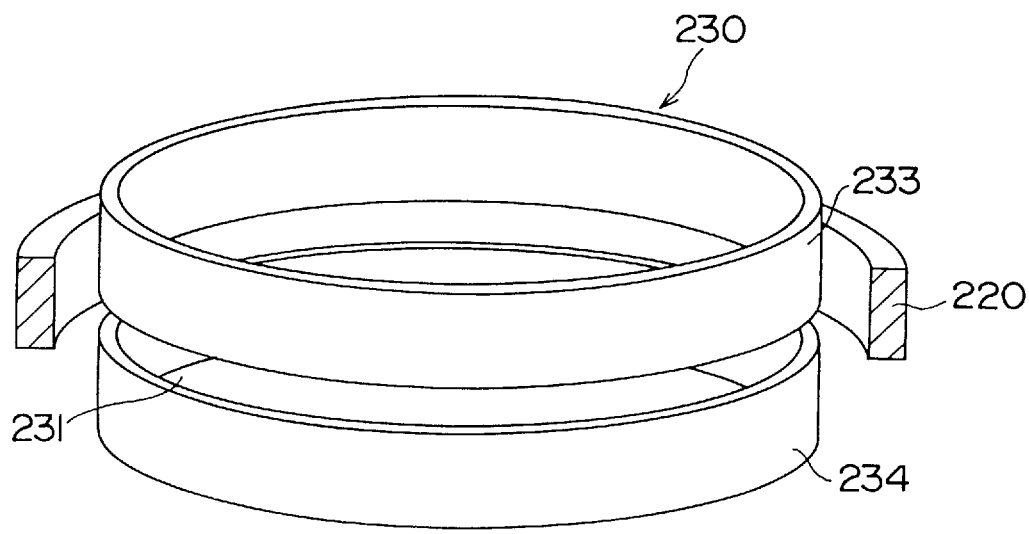
FIGS. 18 and 19 are perspective diagrams of two different examples of the arrangement of anode and cathode electrodes in the apparatus of FIG. 17.

An opening portion 231 is provided in the anode electrode 230 so that, as will be described below, a plasma flow can be supplied to the plasma processing space of the processing chamber 202 through the opening portion 231. The opening portion 231 could be configured of a slit shape, as shown in FIG. 18. In the example shown in FIG. 18, the anode electrode 230 is configured of a pair of annular rings 233 and 234 with the slit 231 formed between these rings 233 and 234. The cathode electrode 220 in FIG. 18 is configured of an annular ring in the same manner as the anode electrode 230, positioned such that it covers the slit 231 in an annular fashion from the outside. By configuring the anodes in this way, it becomes possible for the electron flow emitted from the cathode electrode 220 to be supplied into the processing chamber 202 through the anode slit 231.

Figure 19:
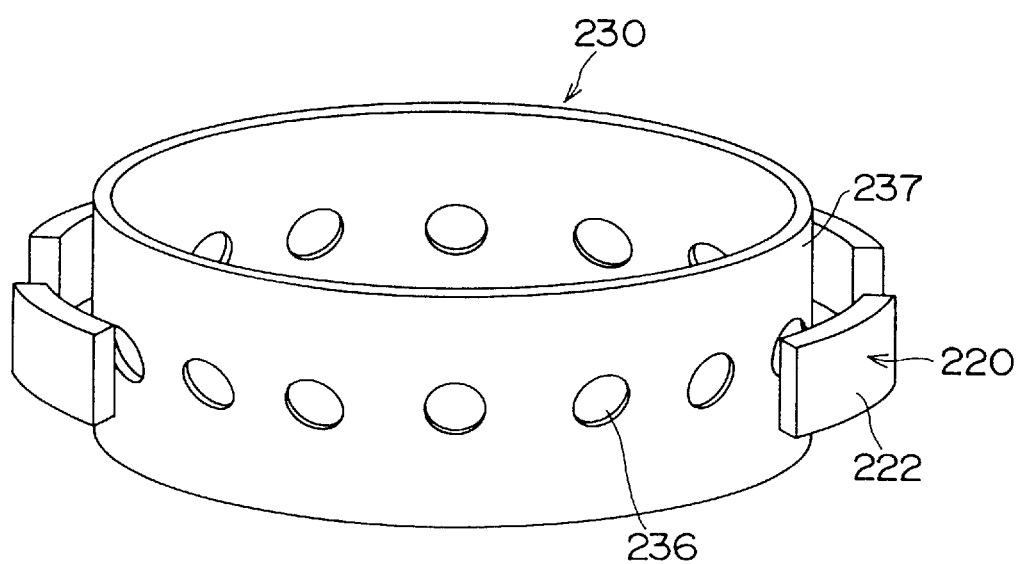

A further embodiment of the cathode electrode 220 and anode electrode 230 is shown in FIG. 19. In this embodiment, the anode electrode 230 is configured of a single annular ring 237 pierced with a plurality, such as 24, of hole portions 236. The cathode electrode 220 is configured of the same number of arc-shaped electrode pieces 222 as the hole portions 236, with the plurality of electrode pieces 222 being arranged so as to cover the hole portions 236 in a concentric manner from the outside. With this configuration, the electron flow emitted from the electrode pieces 222 can be made to flow into the processing chamber 202 through the opening portions, i.e., the hole portions 236, in the anode electrode 230.

The operation of the above plasma etching apparatus will now be described.

A semiconductor wafer W conveyed into the evacuated processing chamber 202 from a loadlock chamber (not shown in the figure) through a gate valve (also not shown in the figure) is mounted on and fixed to the mounting stand 208 by a fixing means such as an electrostatic chuck. Next, argon is introduced from a gas source 212 through a gas introduction port 213 and also a charge is generated between the two electrodes by applying a voltage thereto. As a result, an electron flow emitted from the cathode electrode 220 toward the anode electrode 230 passes through the opening portion 231 of the anode electrode 230 and, at the same time, an accelerated plasma flow is generated and the generated plasma is sent into the plasma processing space at the center of the processing chamber 202.

The thus generated plasma P is shaped into a uniform sheet by the cusped magnetic field surface formed so as to cut horizontally through the plasma processing space. The thus shaped plasma has a high density and is sufficient to cover the entire surface of the large-diameter semiconductor wafer W. Further, the plasma P controlled into a sheet by the cusped magnetic field surface is a gentler plasma that those formed by other methods, and thus plasma control in the plasma processing space is easier.

In this manner, etching is implemented with respect to the semiconductor wafer W on the mounting stand 208 by an etching gas introduced from the etching gas introduction port 207 on the shoulder of the processing chamber 202. During this time, since the cusped magnetic field is used to spread the plasma in a plasma diffusion portion, the effects of the magnetic field in the plasma diffusion portion can be controlled to be a minimum.

After the etching is completed, the etched semiconductor wafer W is conveyed out into the loadlock chamber (not shown in the figure) through the gate valve (also not shown in the figure), and also the exhaust port 204 is opened to exhaust the interior of the processing chamber 202 and thus complete the processing cycle.

Figure 17:
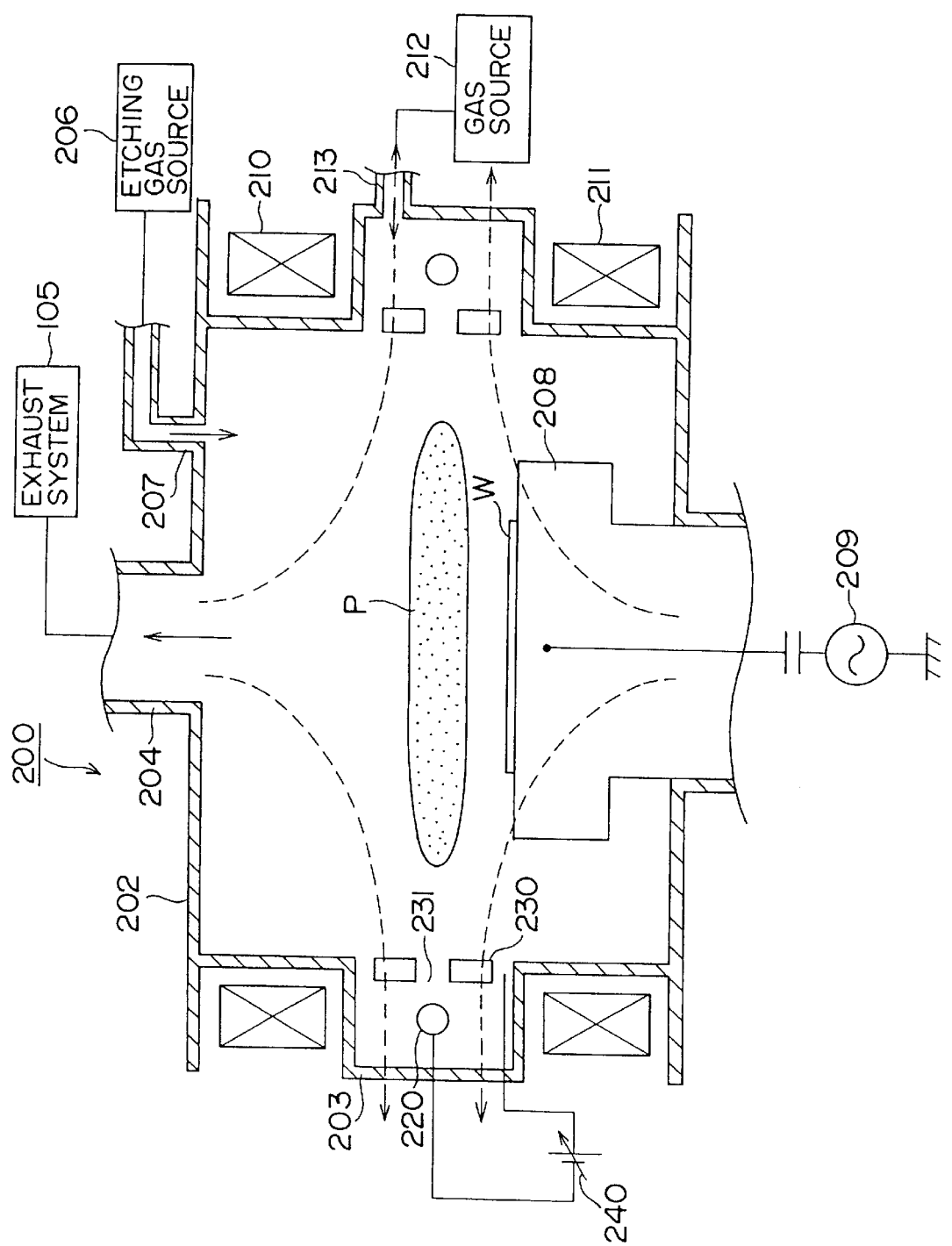
FIG. 17 is a schematic diagram of a plasma apparatus capable of being used for implementing the etching process of the present invention.
Figure 20:
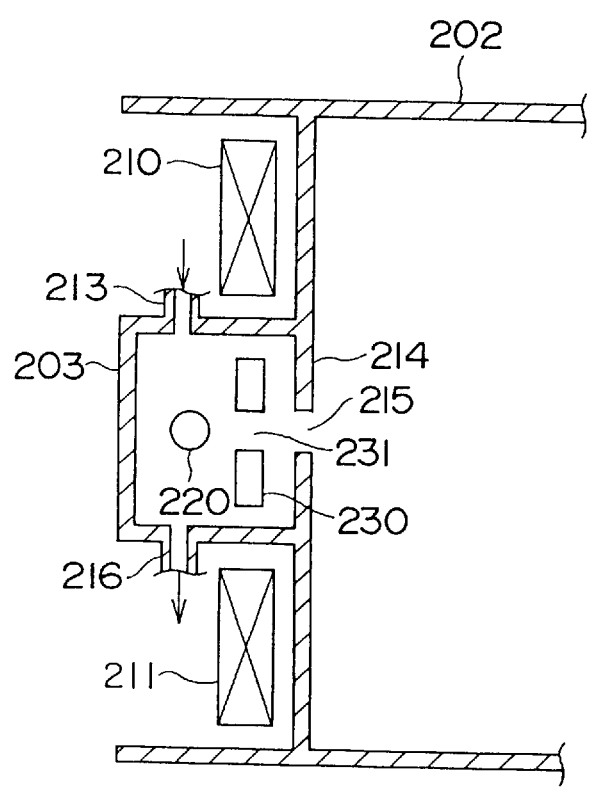
FIG. 20 is a partial cross-section view of an example of the separation of a plasma generation chamber from a plasma processing chamber.

In the apparatus shown in FIG. 17, the plasma generation chamber 203 is configured as an integral part of the plasma processing chamber 202, but the plasma generation chamber 203 could equally well be configured to be separated from the plasma processing chamber 202. The plasma generation chamber 203 could be isolated from the processing chamber 202 by an isolating wall 214, as shown in FIG. 20. However, an opening portion 215 is provided in the isolating wall 214, and the plasma processing chamber 202 and the plasma generation chamber 203 are connected by this opening portion 215. The opening portion 215 is provided at a position corresponding to the opening portion 231 provided in the anode electrode 230 and, as a result, the plasma flow emitted from the cathode electrode 220 and accelerated by the opening portion 231 of the anode electrode 230 can be introduced into the plasma processing space within the processing chamber 202.

A gas introduction port 213 for plasma generation is provided in the plasma generation chamber 203 configured in this manner, in the same way as in the apparatus of FIG. 17, and also an exhaust system 216 that is independent of the exhaust system 204 and 205 of the processing chamber 202 is provided, and thus the pressure within the plasma generation chamber 203 can be adjusted to be, for example, a few milliTorr to a few tens of Torr, preferably 2 to 3 Torr. As a result, the pressure environment of the plasma generation chamber 203 can be formed independently of that of the processing chamber 202, and thus the optimum environment can be achieved in each chamber, even when the plasma generation environment and the processing environment are different. Since a pressure gradient is formed through the opening portion 215 between the plasma generation chamber 203 and the processing chamber 202, the charging phenomenon from the cathode electrode 220 to the anode electrode 230 is promoted.

Figure 21:
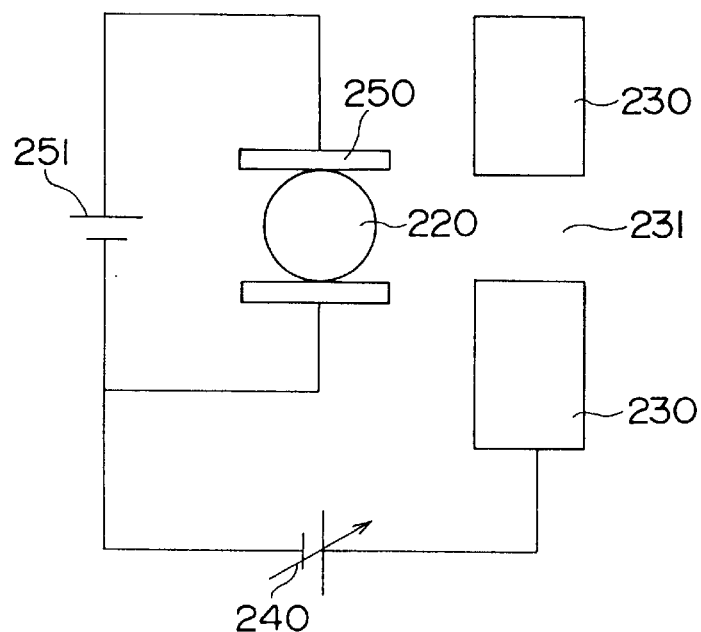
FIGS. 21 and 22 are views of two examples of the configuration when the cathode electrode is formed as a hot cathode.
Figure 22:
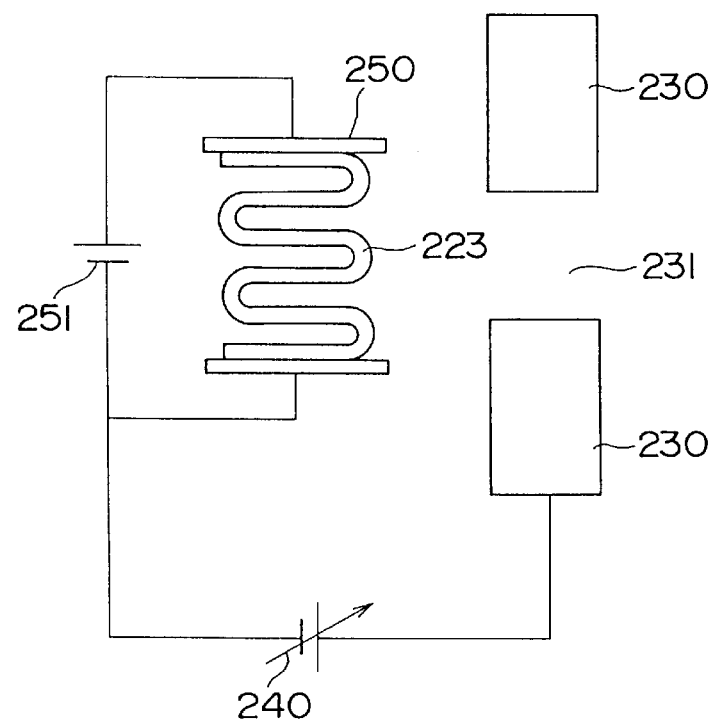

The cathode electrode 220 of FIG. 17 could be configured as a hot cathode. A corresponding example will now be described with reference to FIG. 21 and FIG. 22. As shown in FIG. 21, the cathode electrode 220 is sandwiched between resistance elements 250, and by connecting them to a fixed-current source 251 at, for example, 20 volts, the entire cathode electrode can be heated as a resistor, and since hot electrons can be generated from the cathode, the rise in charge can be done rapidly and simply. This configuration ensures that the plasma can be generated at a low voltage of, for example, 40 to 50 volts, and thus the damage concomitant with the processing can be held to a minimum. Alternatively, the resistance of the cathode electrode could be increased by configuring the electrode of a zigzag structural member 223, as shown in FIG. 22. Note that resistance elements 250 are used in the figures by way of example, but if sufficient heating can be ensured for the cathode electrode alone, these resistance elements 250 could be omitted.

In accordance with the plasma etching apparatus as described above, it is possible to generate a large-diameter, high-density, and highly uniform plasma by an apparatus of a simple configuration. Further, the magnetic field in the plasma diffusion portion can be made small, and a comparatively gentle plasma can be generated, so that the undesirable effects of plasma processing can be suppressed to a minimum.

In accordance with the above described plasma etching apparatus, a high degree of selectivity can be obtained, even when etching is performed with respect to an object to be processed such as a semiconductor wafer W configured of a substrate that is a metal such as aluminum with a nitride layer such as SiN or TiN. Since, of course, the selectivity with respect to silicon is held at the same high level as before, etching can be performed with a high level of selectivity for oxides and nitrides formed on the substrate, irrespective of the type of substrate.

Moreover, if the substrate is of a metal such as aluminum, not only a high level of selectivity, but also extremely good etching can be provided since virtually no fences formed of deposits are created within etched holes.

If $C_4F_8$ is used as the $C_xF_y$ gas, a particularly high selectivity together with a complete prevention of fence formation can be envisioned.

Further, if the mixing ratio of the carbon monoxide mixed in with the $C_xF_y$ gas is at least 50%, it becomes possible to envision an even higher selectivity together with a complete prevention of fence formation.

Even further, by adding at least 86% of an inert gas to the etching gas, gases such as halogenated carbon gases can be excluded by the sputtering effect thereof, so that etching is promoted, and the further addition of a gas containing oxygen means that the side walls of the contact holes become perpendicular to the etching surface and etching is further promoted.

What is claimed is:

1. An etching process comprising the steps of: placing an object to be processed in a processing chamber, creating a vacuum within said processing chamber, introducing a gas mixture into said processing chamber and subjecting said object to be processed to etching, and wherein said gas mixture consists essentially of an etching gas of a mixture of carbon monoxide and a gas which is free from hydrogen and which contains an element from the group IV elements and an element from the group VII elements, the carbon monoxide having a concentration in the etching gas of at least 50%, but less than 100%, wherein a selectivity of an oxide layer is high with respect to a substrate layer for a plurality of different substrates and said high selectivity is based on a comparison with said process when carried out using a hydrogen-containing gas, wherein the formation of fences is prevented;

a quantity of an inert gas equal to or more than approximately 86% of the etching gas; and a gas containing oxygen.

2. An etching process according to claim 1, wherein said gas containing oxygen is $O_2$.

3. An etching process according to claim 1, wherein said gas containing an element from the group IV elements and an element from the group VII elements is a halogenated carbon gas.

4. An etching process according to claim 3, wherein said halogenated carbon gas is selected from a group consisting of saturated fluorocarbon gases, nonsaturated fluorocarbon gases, saturated hybrid halogenated carbon gases, and nonsaturated hybrid halogenated carbon gases.

5. An etching process according to claim 3, wherein said halogenated carbon gas is a gas having the formula $C_xF_y$, where $y \leq 2x+2$.

6. An etching process according to claim 3, wherein said halogenated carbon gas is $C_4F_8$.

7. An etching process according to claim 1, wherein the concentration of carbon monoxide in said etching gas is at least 75% but less than 100%.

8. An etching process according to claim 1, wherein the volume of said gas containing oxygen is 10 sccm or less.

9. An etching process according to claim 1, further including the steps of:

generating a helicon wave by an alternating-current electric field and a magnetic field by high-frequency electrical power;

generating a plasma using energy from said helicon wave;

performing the etching on said object to be processed in an environment containing said plasma; and generating an electronic cyclotron resonance region in a vicinity of said object to be processed.

10. An etching process according to claim 9, wherein said electronic cyclotron resonance region is generated by an auxiliary magnetic field generation means.

11. An etching process according to claim 9, wherein said electronic cyclotron resonance region is generated by an auxiliary magnetic field generation means.

* * * * *